United States Patent [19]

Okada et al.

[11] 3,887,993

[45] June 10, 1975

[54] METHOD OF MAKING AN OHMIC CONTACT WITH A SEMICONDUCTOR SUBSTRATE

[75] Inventors: Takashi Okada; Sokichi Yamagishi; Mototaka Kamoshida; Tomomitsu Satake; Sadayuki Kishi, all of Tokyo, Japan

[73] Assignee: Nippon Electric Company, Limited, Tokyo, Japan

[22] Filed: Aug. 27, 1973

[21] Appl. No.: 391,820

[30] Foreign Application Priority Data

Aug. 28, 1972 Japan ............................ 47-85288

[52] U.S. Cl. .................... 29/571; 29/578; 357/42; 357/23

[51] Int. Cl. ........................................ B01j 17/00

[58] Field of Search ........ 29/571, 578; 148/1.5, 188

[56] References Cited

UNITED STATES PATENTS

| | | | |
|---|---|---|---|
| 3,601,888 | 8/1971 | Engeler | 29/578 |
| 3,646,665 | 3/1972 | Kim | 29/571 |
| 3,673,679 | 7/1972 | Carbajal | 29/571 |

*Primary Examiner*—Roy Lake
*Assistant Examiner*—Tupman
*Attorney, Agent, or Firm*—Sandoe, Hopgood & Calimafde

[57] ABSTRACT

Disclosed is a method of producing a semiconductor device in which a p-n junction and an ohmic contact with the semiconductor substrate are simultaneously formed. A layer of a metal containing an impurity of one conductivity type is deposited on a surface of a semiconductor body of the opposite conductivity type. The metal layer is then subjected to heat treatment, thereby to cause the impurity to diffuse into the semiconductor body to form the p-n junction. At the same time, a compound is formed of the metal and the semiconductor which serves as an ohmic contact with the semiconductor body at the region in which the impurity is diffused.

5 Claims, 14 Drawing Figures

METHOD OF MAKING AN OHMIC CONTACT WITH A SEMICONDUCTOR SUBSTRATE

This invention relates generally to semiconductor devices, and more particularly to a method of forming a p-n junction in a semiconductor device by diffusing an impurity into a semiconductor substrate.

In the manufacture of semiconductor devices, the surface concentrations of impurities and their diffusion depths must be precisely controlled. Several techniques are known and are in use to achieve precisely controlled doping, such as the alloying, the diffusing, and the vapor growing methods. Other methods have been introduced into the manufacturing process of semiconductor devices in recent years. One such method is the doped oxide method, as disclosed in U.S. Pat. No. 3,200,019, in which a silicon dioxide film or glass layer containing an impurity is chemically deposited on a semiconductor substrate, followed by the diffusion of an impurity into the semiconductor substrate by heat treatment. Another method is the ion-implantation method as disclosed in U.S. Pat. No. 2,787,564 in which ionized and accelerated impurities are implanted into a semiconductor material.

Probably the most widely used of these methods is the thermal diffusion method. The diffusion sources for this method are available in various phases, such as solid, liquid, or gaseous substances. Usually, liquid halides or gaseous substances, such as hydrides, are used for ease in achieving precise control for the diffusion. In case of the diffusion of boron, for instance, the following chemical reactions take place by introducing boron tribromide ($BBr_3$) as a diffusion source together with oxygen:

$$4BBr_3 + 3O_2 \rightarrow 2B_2O_3 + 4Br_3$$

$$2B_2O_3 + 3Si \rightleftarrows 3SiO_2 + 4B$$

As a result, a glass layer containing boron is formed on the silicon and the impurity is diffused from the glass layer into the silicon by heat treatment. When phosphorus or arsenic is diffused, the diffusion usually progresses through similar chemical reactions.

With the thermal diffusion method, however, the boron content in the glass layer is likely to be unexpectably high and the boron impurity is then pre-deposited on the semiconductor surface up to a concentration allowed by its solid solubility limit. As a result, plastic deformations are caused in the diffused layer of the semiconductor. The occurrence of abnormally rapid diffusion of boron or phosphorus in a process which diffuses the impurity at a high concentration is believed to be caused by this plastic deformation, the built-in-field caused by the impurity distribution, and the degeneration of the silicon crystal.

Therefore, it has heretofore been difficult to form shallow junctions or to precisely control impurity concentrations on the surface of the semiconductor by the known methods.

With the increasing demand in recent years toward improvements in the cutoff frequency and current gain of semiconductor devices, an abrupt step-type impurity distribution is often desired. In order to realize such an impurity distribution, the junction depths should be as shallow as possible. It is, however, difficult to connect such shallow junctions with ohmic electrodes, because in the conventional thermal diffusion techniques, the impurity concentration on the silicon surface tends to become high, and the lattice defect is liable to occur in the crystal often resulting in troubles such as the diffusion pipe of an electrode metal into the semiconductor substrate during heat treatment and the penetration of the metal through junctions. When shallow p-n junctions are formed in silicon with the planar techniques and the electrodes are about to be ohmically adhered by aluminum metallization, the aluminum tends to penetrate through the interface between the insulating passivation film and silicon, thereby shorting the junctions.

With semiconductor elements for which high frequency application or high-speed operation is required, windows opened in a passivation film for emitter diffusion must be used for deriving electrodes. However, re-opening of the windows for deriving electrodes sometimes results in the exposure of the p-n junction and in the shorting of the junction as a result of the electrode metallization. Similar difficulties are also encountered in the fabrication of semiconductor devices with the doped oxide method.

In a conventional doped polysilicon method, such as disclosed in U.S. Pat. No. 3,460,007, polycrystalline silicon containing the impurity is deposited over the regions of a silicon substrate from which the impurity is to be diffused into the substrate. By diffusing the impurity into the silicon substrate by heat treatment, electrode metallization can be formed without removing the polycrystalline silicon layer used for diffusion. Therefore, there is no possibility in the doped polysilicon method of shorting the p-n junction. This method, however, has a defect in that the resistivity of the polycrystalline silicon used as the electrodes is high.

It is, therefore, an object of this invention to provide a method for diffusing an impurity into a semiconductor substrate which achieves precise control of both impurity concentration and diffusion depth.

It is another object of the present invention to provide a method of manufacturing semiconductor devices with a shallow p-n junction and an ohmic electrode structure containing a minimum number of unwanted resistive components and having no possibility of shorting the shallow p-n junction.

According to this invention, a metal, such as tungsten, platinum, or molybdenum, which contains at least one kind of impurity, such as arsenic, boron, phosphorous or antimony is first deposited on a semiconductor substrate having a conductivity type opposite to that of the impurity contained in the metal. The metal preferably has a higher melting point than the semiconductor substrate and a smaller diffusion coefficient for the substrate than that of the impurities. The concentration of the impurity with respect to the whole mass of the metal and the impurity should be between 0.01 wt. % and 60 wt. %. More particularly, the impurity concentration should be between 0.08 wt. % and 50 wt. % for arsenic, between 0.01 wt. % and 13 wt. % for boron, between 0.03 wt. % and 30 wt. % for phosphorous, and between 0.1 wt. % and 60 wt. % for antimony, respectively. After depositing the metal containing the impurity, a heat treatment is carried out to form a shallow p-n junction in the semiconductor substrate by thermally diffusing the impurity contained in the metal into the semiconductor substrate. The heat treatment is preferably carried out at a temperature of between 900°C and 1200°C. for a period of between 5 minutes and 100 minutes. By this heat treatment, the impurity is diffused into the semiconductor substrate at a concentration between $3 \times 10^{17}$ cm$^{-3}$ and $3 \times 10^{20}$ cm$^{-3}$ and at a depth between 0.1 $\mu$ and 6 $\mu$. In the semiconductor device produced by the invention, the metal forms an optimum ohmic contact with the semiconductor substrate.

This invention is based on the fact that because tungsten, platinum and molybdenum have a diffusion coefficient that is considerably lower than that of an impurity such as arsenic, boron, phosphorous or antimony contained in the metal, the impurity and not the metal mainly diffuses into the semiconductor substrate by heat treatment. At the same time, the metal partially or wholly reacts with the semiconductor to form a good ohmic contact with the semiconductor.

Excellent advantages are attained by the performance of the method of the invention. A first advantage is the ease of control of impurity concentrations which is attained - that is, the surface impurity concentration of the semiconductor can be controlled by initially controlling the amount of the impurity in the metal. In contrast, with a conventional method, the impurity diffuses into a semiconductor in amounts up to the limitation of its solid solubility. A second advantage of this invention resides in the ease of ohmic contact formation for shallow p-n junctions. This is attributable to the fact that, when silicon is used as a semiconductor substrate, a metal silicide is formed by a solid phase reaction between the metal and the silicon. Furthermore, in the process of stacking another metallic layer such as aluminum upon the metal silicide, no heat treatment is required. This dispenses with the heat treatment at high temperatures in the neighborhood of the eutectic point of aluminum and silicon after aluminum metallization in order to obtain an ohmic contact as with the conventional method and yet, succeeds in the formation of ohmic contact even for shallow p-n junctions.

Further, since a solid phase reaction is used at a relatively low temperature, the metal deposited on the semiconductor substrate does not present a molten state. Therefore, the possibility of uneven contact with a semiconductor substrate can be eliminated. Still further, the method of this invention does away with the need for a conventional pre-treatment process before wiring metallization that has heretofore been necessary to remove the glass layer formed over the surface of the semiconductor substrate in a conventional gaseous diffusion process, because a glass layer is not formed on the surface of the semiconductor substrate during the impurity diffusion process of this invention. A third advantage of this invention is the stability of the ohmic contact formed between the wiring metal layer and the semiconductor substrate even at high temperatures. According to experimental data with a semiconductor device fabricated by the first embodiment of this invention described hereinafter, ohmic contacts capable of withstanding temperatures of the order of 650°C were obtained.

A further advantage of the invention is that, since the metal used for impurity diffusion is also employed as an ohmic electrode without removal, the resisitivity of the ohmic electrode can be greatly reduced as compared with ohmic electrodes formed by the conventional method of employing polycrystalline silicon containing an impurity.

yet another advantage of this invention is the capability of simultaneous by diffusing impurities of different kinds, of two different conductivity types, or of different concentrations in the same process by the deposition of a single metal layer containing two or more kinds of impurities, or by separate depositions of one metal layer containing one impurity and another metal layer containing another impurity. Therefore, the difficulties encountered in the conventional method requiring a plurality of diffusion processes which causes p-n junctions formed by a previous diffusion process to be displaced by a succeeding diffusion process are prevented by this invention.

The above and further objects, features and advantages of the present invention will become apparent from the following detailed description of embodiments taken in conjunction with the accompanying drawings, wherein:

FIGS. 1 (A) -(D) are diagrammatic cross sectional views at various process steps of fabricating a semiconductor device according to a first embodiment of this invention;

Figure 5A:
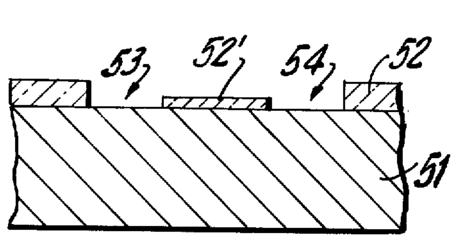
Figure 5B:
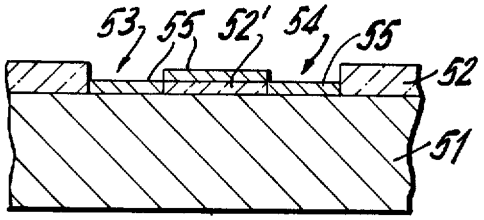
Figure 5C:
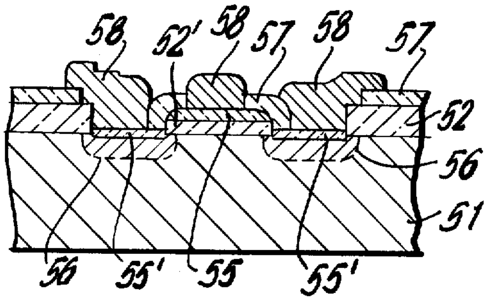
Figure 6:
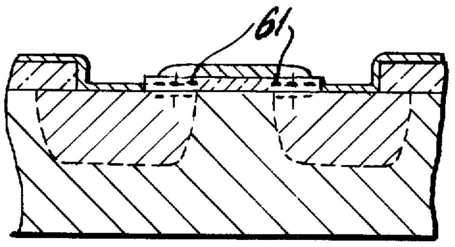

FIGS. 5 (A) -(C) are cross-sectional views at various process steps of the fabrication of a MOS transistor according to a second embodiment of this invention;

FIG. 6 is a cross sectional view of a conventional MOS transistor; and

Figure 7A:
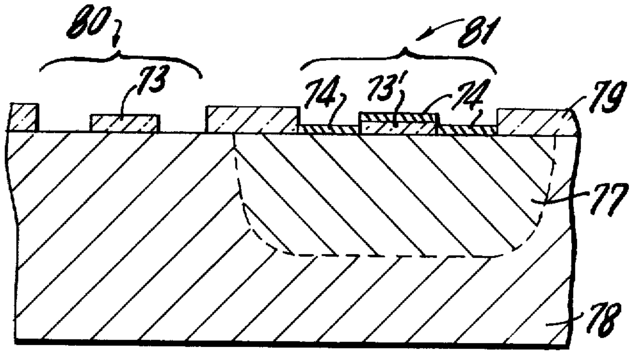
Figure 7B:
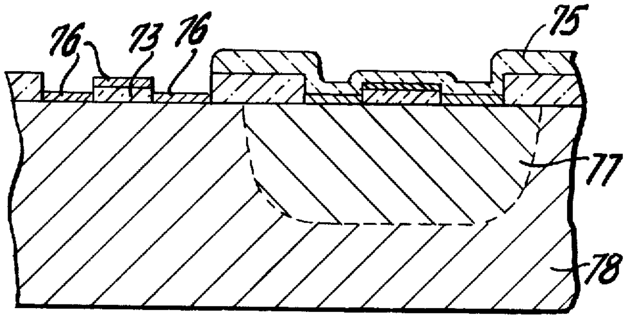
Figure 7C:
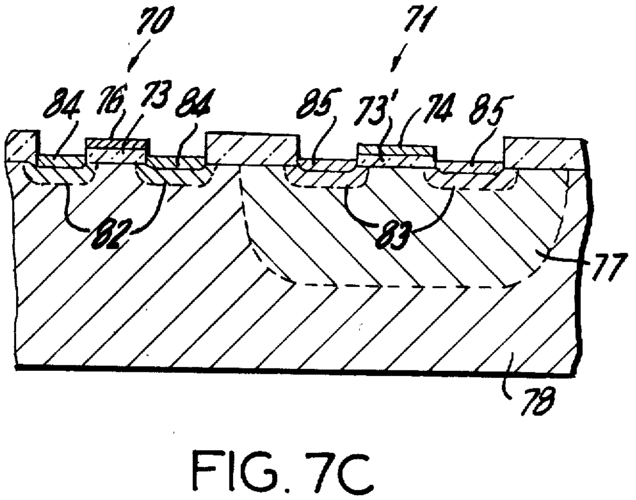

FIGS. 7 (A) -(C) are cross-sectional views at various process steps in the fabrication of complementary MOS transistors according to a third embodiment of this invention.

Referring now to FIGS. 1 (A) -(D), there is illustrated the major steps of the embodiment of the method of the invention in which arsenic is diffused into silicon by the use of tungsten containing arsenic.

In this method, a thin p-type silicon wafer 12 having an impurity concentration of $8 \times 10^{17}$ cm$^{-3}$ coated with a silicon dioxide film 11, as shown in FIG. 1 (A), is prepared and an opening 13 for selective diffusion is provided in the silicon dioxide film. Then, as shown in FIG. 1 (B), a tungsten layer 14 containing arsenic is chemically grown on the silicon wafer 12 and the silicon dioxide film 11 at a temperature of 700°C by use of the apparatus shown in FIG. 2. In this process, the tungsten layer 14 containing arsenic is grown by two chemical reactions. One is to decompose tungsten hexafluoride into metallic tungsten in the presence of hydrogen according to the chemical reaction.

$$WF_6 + 3H_2 \rightarrow W + 6HF$$

and the other is to precipitate arsenic by thermal decomposition according to the reaction $$2A_sH_3 \rightarrow 2A_s + 3H_2.$$

Figure 1A:
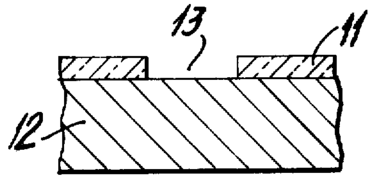
Figure 1B:
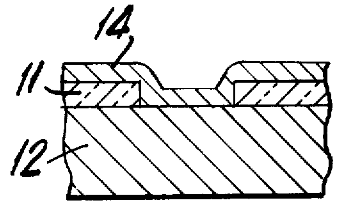
Figure 2:
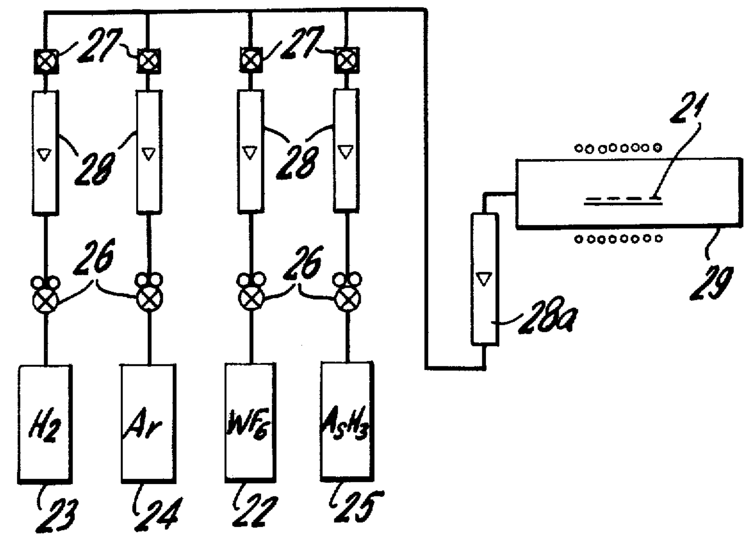
FIG. 2 is a schematic diagram of apparatus used in the performance of the method illustrated in FIGS. 1 (A)-(D)
Figure 1C:
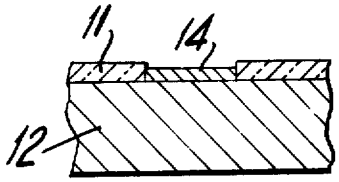
Figure 1D:
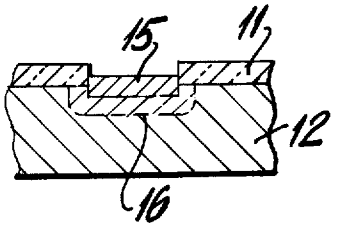

An apparatus for carrying out these reactions is illustrated in FIG. 2, wherein; argon is introduced as a carrier gas and the concentration of the arsenic in the tungsten layer 14 is controlled by adjusting the pressure-reducing valves 26 connected to the outlets of the tungsten hexafluoride, hydrogen, argon, and arsin ($AsH_3$) containers 22, 23, 24 and 25, respectively. A flow-meter 28 is connected to each of the valves 26 and a valve 27 is connected at the outlet of each of the flow-meters 28. An additional flow meter 28*a* is connected between the valves 27 and a reactor tube 29 which contains the semiconductor wafer 21 being processed.

Returning to the description of the method illustrated in FIG. 1, the tungsten layer 14 on the silicon oxide film 11 is then etched away as shown in FIG. 1 (C), and heat treatment is carried out at a temperature ranging between 950°C and 1,000°C. The selective etching of the tungsten layer 14 can easily be effected by the well known photoetching process using a mixed solution in the ratio of 1:1 of hydrogen peroxide and ammonia, or a mixed solution of fluoric and nitric acids, or phosphoric acid. The heat treatment is carried out in an inert gas in a nitrogen atmosphere. In performing the heat treatment at a temperature of 1,000°C, the diffusion coefficient of the arsenic is approximately $10^{-15}$ $cm^2$/sec, but that of the tungsten is negligibly small. Detection by the use of X-ray diffraction indicates that the formation of tungsten silicide 15 ($W_2Si$), shown in FIG. 1 (D) begins at a temperature of 750°C and the tungsten layer 14 having a thickness of several thousand angstroms is almost completely converted to the tungsten silicide 15 at a temperature of 1000°C. Since the diffusion coefficient of tungsten is low, the thickness of the tungsten silicide 15 is substantially determined by the thickness of the tungsten layer 14 deposited. The arsenic contained in the tungsten layer 14 has a higher diffusion coefficient than that of the tungsten, resulting in a deeper diffusion of the arsenic impurity than the depth of the tungsten silicide 15, and thus in the formation of a p-n junction as shown at 16 in FIG. 1 (D). The tungsten silicide 15 forms an ohmic contact with the silicon wafer 12.

Since the ohmic contact between the tungsten silicide 15 and the surface of the silicon wafer, and the p-n junction are formed simultaneously, this method has considerable advantages over the known methods such as ease of electrode derivation, and the formation of shallow junctions.

Figure 3:
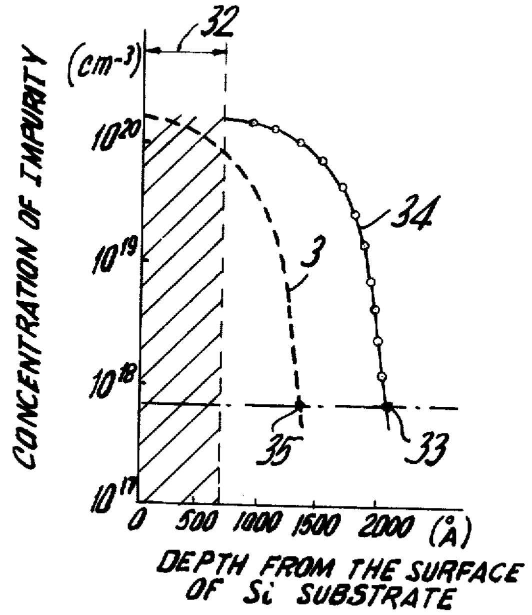
FIG. 3 is a graph illustrating a comparison of impurity concentration distribution curves of a conventional semiconductor device and an improved semiconductor device as fabricated by the method of the present invention.

A step-like impurity distribution is formed according to this embodiment. In FIG. 3, there is plotted, as a function of the distance from the surface of the silicon wafer 12, the concentration indicated by the solid-line curve 34 of arsenic diffused in the silicon having a p-type impurity concentration of $8 \times 10^{17}$ $cm^{-3}$ as shown at 35 by heat treatment carried out at a temperature of 1000°C for 15 minutes from the tungsten layer 14 of about 2000 A in thickness which contains arsenic. It can readily be seen that a p-n junction is formed at a level 33 which is deeper by a thickness 32 of the silicon converted to the tungsten silicide than the p-n junction 35 formed by the distribution shown by the broken-line curve 31 of arsenic diffused according to the doped oxide method. Both impurity distribution curves 31 and 34 are extremely similar and both have no exponential tail as usually seen with the conventional gaseous diffusion method.

This diffusion method presenting the distribution curve without an exponential tail is well adapted for controlling the base region thickness of a high-frequency transistor. It has been proven that both the cutoff frequency and the current gain of a transistor in which the base region is formed by the method of the first embodiment of this invention are 1.5 to 1.7 times greater than those of a transistor formed by phosphorus diffusion with the conventional gaseous diffusion method.

Figure 4:
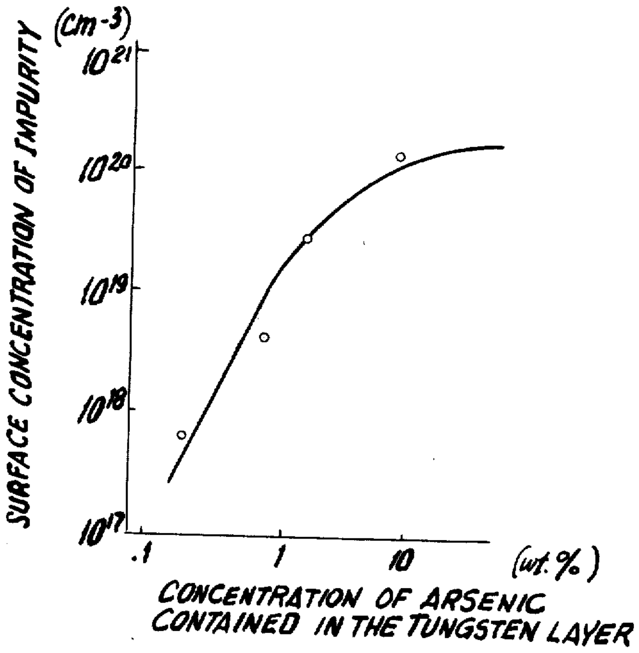
FIG. 4 is a graph illustrating the relationship between the concentration of arsenic in tungsten when tungsten containing arsenic as an impurity is grown on the semiconductor substrate and the concentration of an impurity arsenic diffused into a semiconductor substrate.

Data demonstrating that the arsenic concentration can be varied with the method of the first embodiment are depicted in FIG. 4. By varying the concentration of arsenic in the tungsten from 0.08 to 50 wt. %, the surface impurity concentration Cs of arsenic in the silicon directly under the silicide varies from $3 \times 10^{17}$ $cm^{-3}$ to $3 \times 10^{20}$ $cm^{-3}$. The concentration of arsenic in tungsten can be controlled by changing the flow rate of $AsH_3$ with respect of the $WF_6$ flow.

FIGS. 5 (A) through (C) illustrate the process steps of a method according to a second embodiment of the invention for forming an insulated-gate field effect transistor. The self-aligned MOS insulated-gate field effect transistor formed according to this method has the advantage that the openings in the insulating film covering the semiconductor substrate can be employed both for diffusion into the semiconductor substrate and for making an ohmic contact with the semiconductor substrate.

Referring now to FIG. 5 (A), an insulating film 52 of silicon dioxide is formed on a P-type silicon wafer 51 having an impurity concentration of $10^{16}$ $cm^{-3}$. The insulating film 52 is selectively etched out, and a gate insulating film 52' is formed on the wafer 51 in the opening of the insulating film 52, thereby making openings 53 and 54 through which an n-type impurity is to be diffused for the formation of the source and drain regions. A tungsten layer 55 having a thickness of 1000 A and containg arsenic in a concentration of 2 wt. % is then formed in the openings 53 and 54 and on the gate insulating film 52' by the same method as used in the first embodiment, as shown in FIG. 5 (B). Then the whole is subjected to heat treatment at a temperature of 1100°C for 50 minutes, with the result that p-n junctions 56 of a depth of 1.5 $\mu$ are formed as shown in FIG. 5 (C). Tungsten formed on the gate insulating film 52' does not react with silicon and hence, remains as it is. A glass layer 57 is deposited on the whole surface by a vapor deposition process and holes to derive electrical wirings are selectively formed to expose tungsten and tungsten silicide layers 55 and 55', and aluminum wiring layers 58 are provided to connect with the tungsten and the tungsten silicide layers 55 and 55', respectively.

Since the ohmic contact to the slicon substrate is already formed with the tungsten silicide layers 55', a heat treatment is not required after the formation of aluminum wiring layers 58 as is required in the conventional method in order to obtain an ohmic connection between the aluminum wiring layers and the silicon substrate. Such heat treatment, if needed, may be performed at low temperatures.

Referring now to FIG. 6, which shows a cross-sectional view of an MOS transistor fabricated according to a conventional method, it will be seen that the separate processes for the impurity diffusion and for the electrode formation are necessary. Therefore, tolerance of mask alignment corresponding to 5 microns in width for opening windows for the impurity diffusion and electrode formation is required in the photoetching process. This tolerance of mask alignment can be reduced by the second embodiment of this invention shown in FIG. 5, resulting in the stray capacitance 61 shown in the MOS transistor of FIG. 6 being reduced to one-third to one-fifth of its value in a MOS transistor fabricated by a conventional process.

FIG. 7 illustrates the significant process steps of the method of the present invention as employed in the fabrication of complementary MOS transistors. In this embodiment, a p-channel MOS transistor 70 and an n-channel MOS transistor 71 are formed through a common diffusion process by introducing two different kinds of impurities into tungsten.

Referring to FIG. 7 (A), a p-type region 77 having an impurity concentration of $5 - 10 \times 10^{16}$ $cm^{-3}$ is formed in an n-type silicon wafer 78 having an impurity concentration of $10^{16}$ $cm^{-3}$ by a conventional gaseous diffusion method. An insulator film 79 is formed on the silicon wafer 78. Openings 80 and 81 are formed by etching away predetermined regions of the insulator film 79, opening 80 being formed over the n-type silicon wafer 78, and opening 81 being formed over the p-type region 77. Gate insulator films 73 and 73' are formed on the silicon wafer 78 and on the p-type region 77, respectively, in the openings 80 and 81. A tungsten layer 74 of 1,000 A in thickness containing arsenic at a concentration of 2 wt. % is deposited by the same process as in the first embodiment on the exposed surface of the p-type region 77 and on the gate insulator film 73'.

This is followed by the deposition of a glass layer 75 by a chemical vapor deposition method carried out at a temperature of about 400°C, and the removal of the glass layer 75 on the region where the p-channel MOS field effect transistor 70 is to be formed, as shown in FIG. 7(B). Then, a tungsten layer 70' of 1000 A in thickness containing boron at a concentration of 3 wt. % is deposited on the exposed surface of the n-type silicon wafer 78 and on the gate insulator film 73. This deposition process is accomplished by a similar process as described in the first embodiment, but diborane ($B_2H_6$) is employed instead of arsin ($AsH_3$).

The glass layer 75 is then removed, and the whole is subjected to heat treatment at a temperature of 1100°C for 50 minutes, whereby boron-diffused p-type regions 82 having a thickness of 2 $\mu$ and arsenic-diffused n-type region 83 having a thickness of 1.5 $\mu$ are formed in the n-type wafer 78 and p-type region 77, respectively, and, in addition, tungsten silicide layers 84 and 85 are formed on the thus-formed p-type and n-type regions 82 and 83, respectively, all by the same heat treatment, as shown in FIG. 7 (C). The two p-type regions 82 serve as the source and drain of the p-channel MOS transistor 70, whereas tungsten silicide layers 84 overlying these regions serve as the source and drain electrodes, and tungsten layer 76 on the gate insulator film 73 serves as the gate electrode of the transistor 70. Similarly, the n-type regions 83 serve as the source and drain of the n-channel MOS transistor 71, whereas tungsten silicide layers 85 on these regions serve as the source and drain electrodes and tungsten layer 74 on the gate insulator film 73' serves as the gate electrode of the transistor 71.

As has been mentioned previously, both MOS transistors 70 and 71 are of the self-aligned type. Therefore, low-powered and high-speed complementary MOS transistors 70 and 71 can be fabricated by this method.

While a description has been made above of MOS transistors as an example of forming different kinds of conductivity type regions simultaneously in the embodiment of FIG. 7, it will be obvious to those skilled in the art that the method of the present invention is also applicable with equal advantage to the manufacture of other kinds of semiconductor devices.

Althouggh a few embodiments of this invention using tungsten as a metal containing an impurity have been described above for the fabrication of semiconductor elements using silicon, this invention should by no means be restricted to this combination; any other metal having a high melting point with respect to a semiconductor substrate and a low diffusion coefficient as compared to that of the semiconductor material, such as platinum or molybdenum, may be used. Further, any other semiconductor material, such as gallium arsenide may be applied for this invention.

Thus, whereas the method of the invention has been herein specifically described with respect to several presently preferred embodiments thereof, it will be apparent that modifications may be made therein, all without departing from the spirit and scope of the invention.

What is claimed is:

1. A method of producing an insulated gate field effect transistor comprising the steps of forming a gate insulator film on a predetermined surface region of a semiconductor substrate of one conductivity type, forming first, second and third layers of a metal, each of said metal layers containing an impurity of the opposite conductivity type on first and second surface regions of said semiconductor substrate and on said gate insulator film respectively, said first and second surface regions being adjacent to said predetermined surface region and being separated from each other, and subjecting said semiconductor substrate with said gate insulator film and said first, second and third layers of metal deposited thereon to heat treatment, to thereby diffuse said impurity contained in said first and second layers of metal into said first and second surface regions of said semiconductor substrate and form a compound of said metal and said semiconductor at said first and second surface regions, whereby said first surface region, said gate insulator film and said second surface region serve as the source region, gate insulator and drain region, respectively, of the field effect transistor and said compound of said metal and said semiconductor at said first and second surface regions serves as ohmic contacts to the source and drain regions of the field effect transistor.

2. The method of claim 1, in which said metal is tungsten and said impurity is arsenic.

3. The method claimed in claim 1, wherein said metal is selected from a group consisting of tungsten, molybdenum, and platinum, and said impurity is selected from a group consisting of arsenic, boron, phosphorous and antimony, said impurity being contained in said metal in a concentration between 0.01 wt. % and 60 wt. %.

4. A method of producing a semiconductor device having first and second insulated-gate field effect transistors, comprising the steps of forming a region of one conductivity type in a semiconductor substrate of the opposite conductivity type; forming first and second gate insulator films respectively on a first predetermined area in said one conductivity type region and a second predetermined area in said semiconductor substrate; depositing first, second, and third metal layers containing a first impurity of said opposite conductivity type respectively on a first surface region of said one conductivity type region, said first gate insulator film, and a second surface region of said one conductivity type region, said first and second surface regions being adjacent to said first gate insulator film and being separated from each other; depositing fourth, fifth, and sixth metal layers containing a second impurity of said one conductivity type on a third surface region of said substrate, said second gate insulator film, and a fourth surface region of said substrate, respectively, said third and fourth surface regions being adjacent to said second gate insulator film and being separated from each other; and subjecting said semiconductor substrate with said first and second gate insulator films and said first, second, third, fourth, fifth and sixth metal layers deposited thereon to heat treatment, to thereby diffuse said first impurity into said first and second surface regions and said second impurity into said third and fourth surface regions, whereby a first insulated-gate field effect transistor with said diffused first surface region, said first gate insulator film and said diffused second surface region serving as a source region, a gate insulator and a drain region, respectively, and a second insulated-gate field effect transistor with said diffused third surface region, said second gate insulator film and said diffused fourth surface region serving as a source region, a gate insulator and a drain region, respectively, are formed at the same time.

5. The method claimed in claim 4, wherein said metal layers are comprised of tungsten, said first impurity being arsenic and said second impurity being boron.

* * * * *